United States Patent
Hobelsberger et al.

(10) Patent No.: US 9,488,684 B2
(45) Date of Patent: Nov. 8, 2016

(54) MODULAR EXCITATION SYSTEM

(71) Applicant: ALSTOM Technology Ltd, Baden (CH)

(72) Inventors: Maximilian Hobelsberger, Würenlingen (CH); Markus Quadranti, Wettingen (CH)

(73) Assignee: General Electric Technology GmbH, Baden (CH)

( * ) Notice: Subject to any disclaimer, the term of this patent is extended or adjusted under 35 U.S.C. 154(b) by 293 days.

(21) Appl. No.: 14/279,721

(22) Filed: May 16, 2014

(65) Prior Publication Data
US 2014/0347042 A1    Nov. 27, 2014

(30) Foreign Application Priority Data
May 24, 2013    (EP) .................................... 13169080

(51) Int. Cl.
| | | |
|---|---|---|
| G01R 27/26 | (2006.01) | |
| G01R 31/34 | (2006.01) | |
| H02K 15/02 | (2006.01) | |

(52) U.S. Cl.
CPC ........... *G01R 27/2611* (2013.01); *G01R 31/34* (2013.01); *H02K 15/02* (2013.01)

(58) Field of Classification Search
CPC .................................................. G01R 27/2611
USPC ........................................ 318/154, 153, 140
See application file for complete search history.

(56) References Cited

U.S. PATENT DOCUMENTS

| | | | |
|---|---|---|---|
| 618,050 A | 1/1899 | Barnes | |
| 3,593,102 A * | 7/1971 | Kawashima | H02J 7/166 320/123 |
| 3,702,433 A * | 11/1972 | Gilchrist | H02J 7/247 322/28 |
| 7,049,786 B1 | 5/2006 | Toliyat et al. | |
| 8,400,118 B2 * | 3/2013 | Kamimura | H02P 9/107 322/24 |
| 2005/0243891 A1 | 11/2005 | Ebi | |
| 2006/0132081 A1 | 6/2006 | Clothier et al. | |

FOREIGN PATENT DOCUMENTS

| | | |
|---|---|---|
| EP | 2 541 751 | 1/2013 |
| WO | 2004/106912 | 12/2004 |

OTHER PUBLICATIONS

Zlatanovici, Rodica, and Dan Zlatanovici. "Diagnosis of the Electric Generator Stator Core by Means of the Low Induction Iron Test, PROFIM." *Journal of Sustainable Energy* 2.2 (2011).

* cited by examiner

*Primary Examiner* — David S Luo
(74) *Attorney, Agent, or Firm* — GE Global Patent Operations; Rita D. Vacca

(57) ABSTRACT

An excitation device for high-energy tests of stator cores of electric generators or motors is disclosed. The excitation device includes one or more excitation modules. Each excitation module includes an excitation winding and a power supply configured to drive an excitation current through the excitation winding which contributes to the overall excitation of the stator core. The excitation module further includes a capacitor. The power supply of the excitation module acts as current source at its output.

17 Claims, 4 Drawing Sheets

MODULAR EXCITATION SYSTEM

CROSS-REFERENCE TO RELATED APPLICATIONS

This application claims priority to European application 13169080.2 filed May 24, 2013, the contents of which are hereby incorporated in its entirety.

TECHNICAL FIELD

The present disclosure relates to a modular excitation system for testing the laminations of a stator core. In addition, the present disclosure relates to a high-energy test of a stator core of an electric generator.

BACKGROUND

The stator core of an electric generator is made up of a large number of laminated sheets. These laminated sheets are thin iron sheets with oriented crystals. They are insulated from one another to reduce losses due to eddy (Foucault) currents between the laminations. The assembly of laminations may be mechanically reinforced through a plurality of wedges through the stator yoke as well as rings and pressure plates.

During assembly and also during operation, faults of the insulation between the laminated sheets may occur as a consequence of thermal and magnetic stresses and of mechanical strains and vibrations. These faults short-circuit sheets of the stator. They may result in significant eddy currents circulating between the faulted sheets. The losses due to such eddy currents may result in iron melting and even in thermal failure of the electrical insulation of adjacent stator bars.

There are two established methods of test known as high-energy and low-energy tests. The present disclosure focuses on high-energy tests.

A high-energy test requires a magnetic flux density of about 1.0-1.5 Tesla to be induced in the stator core. The flux density alternates with time in a way similar to the flux density in service. Due to eddy currents sheets with short-circuits will exhibit an increase in temperature which is significantly higher than the average temperature of the stator core. Local overheating is then detected by means of temperature measurements. To that end, infrared cameras may be used.

The high-energy method of testing stator cores has got a number of disadvantages. It requires a high-power supply and a high-power excitation winding. The excitation winding typically consists of several windings of a cable and is adequately dimensioned so the high-power supply can drive sufficient alternating current though the excitation winding. To achieve a magnetic flux density of 1.5 Tesla through the stator core, the high-power supply must provide significant voltage and current.

The currents would typically be in the range of several kA and the voltages in the range of several kV. Consequently, the amount of inductive reactive power required for the test is in the range of several MVAr. The excitation of a 330 MW turbogenerator or of a 50 MW hydro generator would typically require a high-power supply in the form of 4 MVA, 6.3 kV transformer. On-site, neither the power grid nor any other source may be able to supply 4 MVA of predominantly reactive power to a 4 MVA, 6.3 kA transformer.

The above inductive current can, at least in part, be compensated through a capacitor. That capacitor would be connected in parallel to the excitation winding. Especially when testing large electric generators, the windings of the excitation winding may be arranged symmetrically around the stator core. The symmetrical arrangement of the excitation winding yields a more uniform distribution of the magnetic flux density through the core.

The voltages of several kV applied in the high-energy test create a hazard to any personnel in the vicinity of the test. This applies both to the excitation winding and also to any transformer feeding that winding. Consequently, precautions for high-voltage tests such as job safety assessment, fences with interlocks around any high-voltage equipment, switches for emergency de-energization etc apply. All of those precautions make the procedure more onerous and add to the cost of high-energy testing.

Another problem arises due to the non-linear saturation curve of stator iron. The relationship between the magnetic flux density B in the stator core and the excitation current I through a winding with N loops can be described as $$B \propto N \cdot I$$

This relationship is, however, valid only in the linear regime. As the current I through the excitation winding increases, the stator core made of iron laminations saturates. The relationship between the magnetic flux density B and the excitation current I then becomes non-linear. Due to saturation the current I through the excitation winding will increase faster than linear with the magnetic flux density B for B≥1.3 Tesla. It can actually become practically unattainable to supply the reactive current because no adequate source of inductive current is available.

Another approach may make use of a power electronic converter to supply the excitation winding. The reactive power required for the excitation winding can at least in part be provided by a circuit for energy storage integrated in the power electronic converter. An advantage of this solution is that all load cases up to maximum reactive power are covered. A disadvantage of this solution is that the power electronic converter needs be designed for maximum load. This, in turn, adds to the cost of the converter. In addition, the power electronics components inside the converter must be designed to withstand voltages of several kV. Due to the nature of power electronics components such as thyristors and insulated-gate bipolar transistors the requirement of high voltage withstand be difficult to meet.

The approach set out in EP2541751 partially overcomes these issues by providing a plurality of excitation modules each with an excitation winding. The excitation windings are arranged around the stator core and every excitation winding provides a part of the overall excitation. Consequently, the voltage over each excitation winding becomes only a part of the voltage that would exist if there was only one excitation winding. In other words, the aforementioned high-voltage hazard is mitigated. The approach as set out in EP2541751 still falls short of solving the high-current issue. As mentioned above, it may become practically unattainable to supply the full excitation current when the magnetic flux density through the stator core goes into saturation.

The present disclosure is oriented towards providing the aforementioned needs and towards overcoming the aforementioned difficulties.

SUMMARY

The present disclosure is directed to a modular excitation system for testing the laminations of a stator core. The excitation system as per the present disclosure mitigates the aforementioned high-voltage and high-current issues. To that end, a plurality of excitation modules is provided. A typical excitation module comprises an AC-power supply, a capacitor and an excitation winding. However, also excitation modules without capacitor, or excitation windings with only a capacitor, but without power supply, are possible. The number of excitation modules depends on the rated power and on the type of the generator. A synchronization unit is connected to each excitation module. The synchronization unit synchronizes or even sets the current values through each excitation winding. In a preferred embodiment, all of these currents are the same and are synchronized, i.e. have basically the same zero-crossings.

The power supply is characterized by the feature of acting as current source at its power-output. The term "current source" is used here in its specific electrotechnical meaning, denoting, that the actual output current is substantially independent of the actual output voltage. In an equivalent circuit diagram this behavior can be modeled by arranging a high output impedance at the output of the power supply. Both electronic power converters and transformers with high output-impedance in the aforementioned sense of at their outputs are suitable as supplies.

Due to this large output-impedance of the output of the supply, the supply does not respond to e.g. to fast changes in output voltage When the output voltage, i.e. the excitation voltage, experiences a fast rate of change, i.e. has a high (absolute) value of its timely derivative, due to saturation effects of the core, the output current of the power supply will not be affected by that fast rate of change. The excitation current will then be provided to a high degree by the capacitor which is also part of the excitation module. This capacitor is preferably connected in parallel to the excitation winding.

The output impedance of that capacitor would ideally be zero. In practice, the inductances of any leads connecting the capacitor to the circuit will introduce parasitic impedances at its output. These inductive impedances at the capacitor output shall certainly be lower than the output inductance of the supply. Thus, unlike the supply, the capacitor is able to produce rapid increases and decreases in excitation current.

The modular excitation system in principle works at any base frequency of the alternating magnetic flux through the stator core. In a preferred embodiment intended for machines with 50 Hz output, the modular excitation system uses a base frequency between 45 Hz and 55 Hz. In a preferred embodiment intended for electric generators with 60 Hz output, the modular excitation system uses base frequencies between 55 Hz and 65 Hz. These preferred frequencies allow for the test to be carried out close to the base frequencies of the alternating magnetic flux when the electric generator is in-normal operation. It should be noted here that the timely shape of the alternating flux will not necessarily be a sinusoidal one.

The present disclosure relates to a high-energy test of a stator core of an electric generator or motor. To carry out the high-energy test, a plurality of excitation windings is arranged around the stator core. Each excitation winding is then connected to a capacitor and to a supply to form an excitation module. A synchronization unit is connected to all the supplies.

In an exemplary case of electronic supplies working as current sources the supplies receive a signal from the synchronization unit to set their output currents, their frequencies and their relative phases. Inside the supply, a control module receives this signal. The control unit also receives input from a current sensor that measures the output current. The control unit compares the set point to the actual current at its output. The signal from the control module is used to adjust the output current. The adjustment of output current based on a comparison between actual current and a set point then iterates. In a particular embodiment, PID (proportional, integral and derivative) control is employed for the control of the excitation current. In other embodiments, control is based on neural networks or on fuzzy logics or other advanced controller topologies.

BRIEF DESCRIPTION OF DRAWINGS

The foregoing objects and many of the attendant advantages of this invention will become more readily appreciated as the same becomes better understood by reference to the following detailed description when taken in conjunction with the accompanying drawings, wherein.

DETAILED DESCRIPTION

Figure 1:
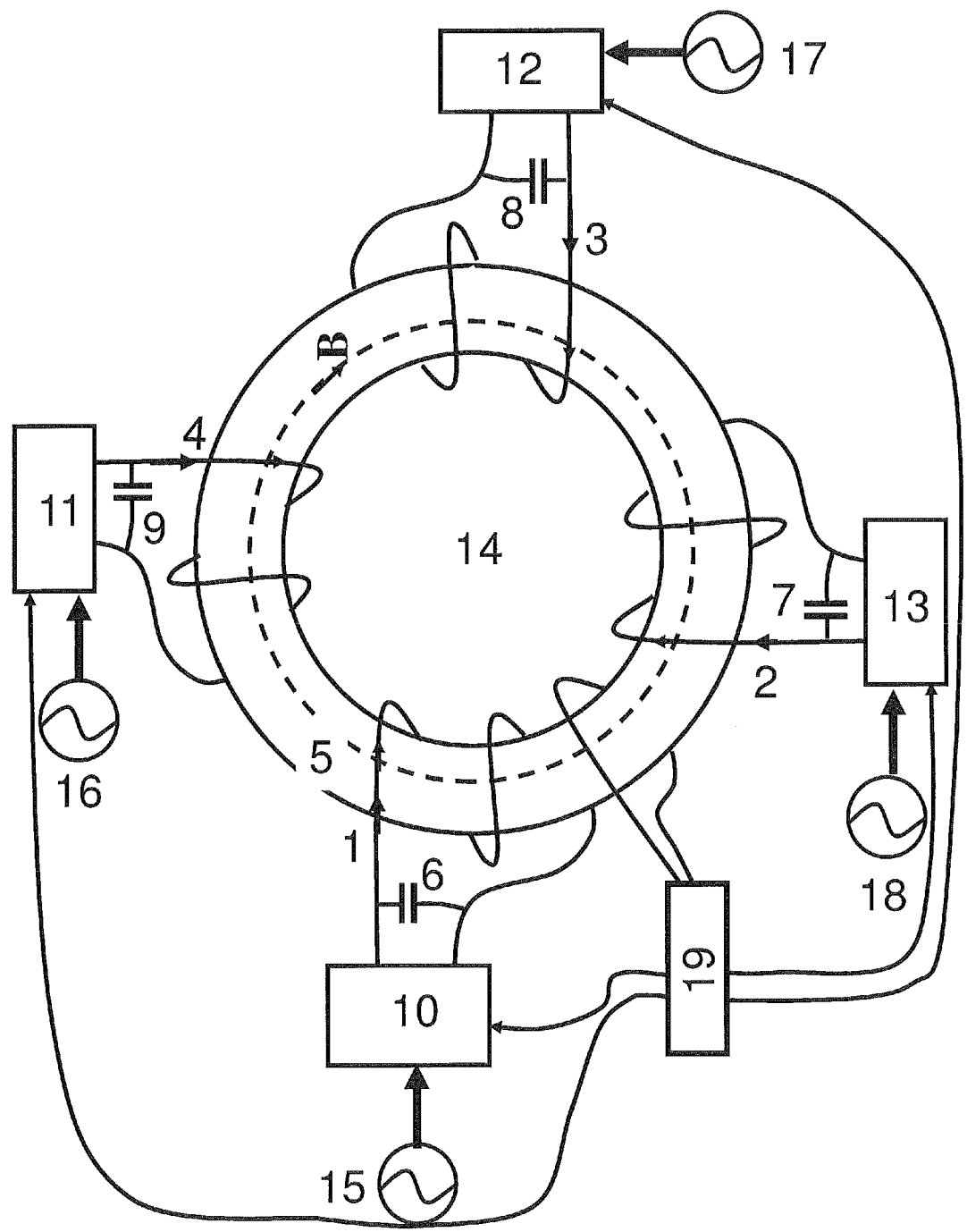
FIG. 1 is a schematic drawing of an excitation device according to the present disclosure.

FIG. 1 is a schematic drawing of the excitation device together with a stator core. FIG. 1 shows four excitation windings 1-4 symmetrically arranged around the stator core 5. The stator core 5 is typically made of a stack of lamination sheets. Before a high-energy test, a rotor is typically removed from the (cylindrical) bore 14 through the center of the stator. The stator core 5 as shown on FIG. 1 is represented by a closed loop of magnetically active material which corresponds to the closed loops formed by the individual laminations and lamination segments of the stator core 5.

Arrows indicate the direction of the currents flowing through the excitation windings 1-4. The excitation currents all contribute in the same direction to the magnetic flux density B inside the stator core 5. The currents through the excitation windings 1-4 are alternating currents. The currents through the excitation windings 1-4 as indicated by the arrows thus changes direction preferably 50 or 60 times per second. The arrows indicate the positive direction of the excitation currents at one moment. The same applies to the magnetic flux density. The current through the excitation windings 1-4 alternates and so does the direction of the magnetic flux density B.

FIG. 1 shows a symmetrical arrangement of four excitation windings 1-4 around one stator core 5. In another embodiment, the excitation windings 1-4 are not symmetrically arranged around the stator core 5. An excitation winding 1-4 would typically comprise between two and five turns. It could, for example, be made up of a low-voltage or medium-voltage, high-current cable wound around the stator core 5.

A capacitor 6-9 is electrically connected to each of the four excitation windings 1-4. In a preferred embodiment, the capacitors 6-9 are connected in parallel to the excitation windings 1-4. In order for the capacitors 6-9 to produce rapid changes of the current through the excitation windings 1-4, parasitic inductive impedances at the outputs of the capacitors 6-9 must be avoided. The electrical connections between the capacitors 6-9 and the excitation windings 1-4 would typically be as short as practically possible.

Each excitation winding 1-4 in FIG. 1 is also electrically connected to a supply 10-13. The embodiment of FIG. 1 shows the excitation windings 1-4, the capacitors 6-9 and the supplies 10-13 connected in parallel. The supplies 10-13 are preferably current sources in the aforementioned sense. Preferably, the output impedances of the supplies 10-13 are at least three times higher than the inductive output impedances of the capacitors 6-9. That way, the capacitors 6-9 allow rapid increases or decreases in current rather than the supplies 10-13. Especially when the iron of the stator core 5 saturates, the current through the excitation windings 1-4 will increase dramatically and rather quickly. The excitation current is then supplied by the capacitors 6-9 rather than by the supplies 10-13. In an optimal case, the supplies 10-13 predominantly provide the active power required to compensate magnetization- and eddy current losses of the stator core 5. The capacitors 6-9 predominantly provide the reactive power required by the load consisting of the excitation coils 1-4 and the stator core 5.

In another preferred embodiment, the supplies 10-13 are transformers with high inductive stray impedances or even separate inductances at the outputs. A transformer with a (stray or separate) inductance of 3 mH at its output would be a typical example.

In another embodiment, a electronic power converter working as voltage source is used as a supply 10-13. A sufficiently large inductance must be connected in series to the output of the electronic power converter in order to attain sufficient output impedance.

In yet another embodiment, the supplies 10-13 of the excitation windings 1-4 are combined into one supply which feeds all of the excitation windings 1-4.

Figure 2:
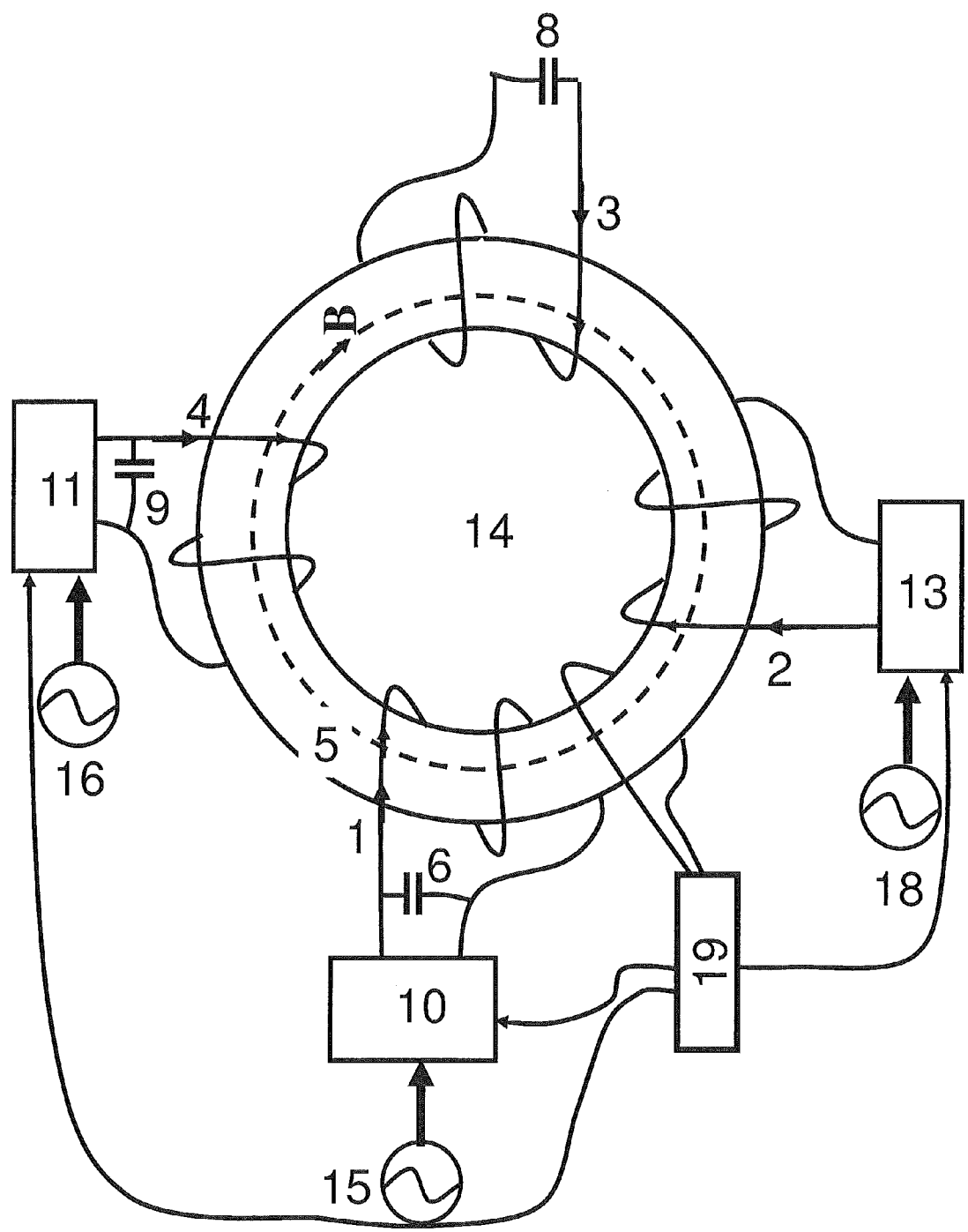
FIG. 2 is another schematic drawing of an excitation device according to the present disclosure.

In a further embodiment (FIG. 2) one or more compensation capacitors (8) are connected to one or more excitation windings (3) without being connected to power supplies. It is also possible to connect a power supply (13) to an excitation winding (2) without a parallel compensation capacitor.

Figure 3:
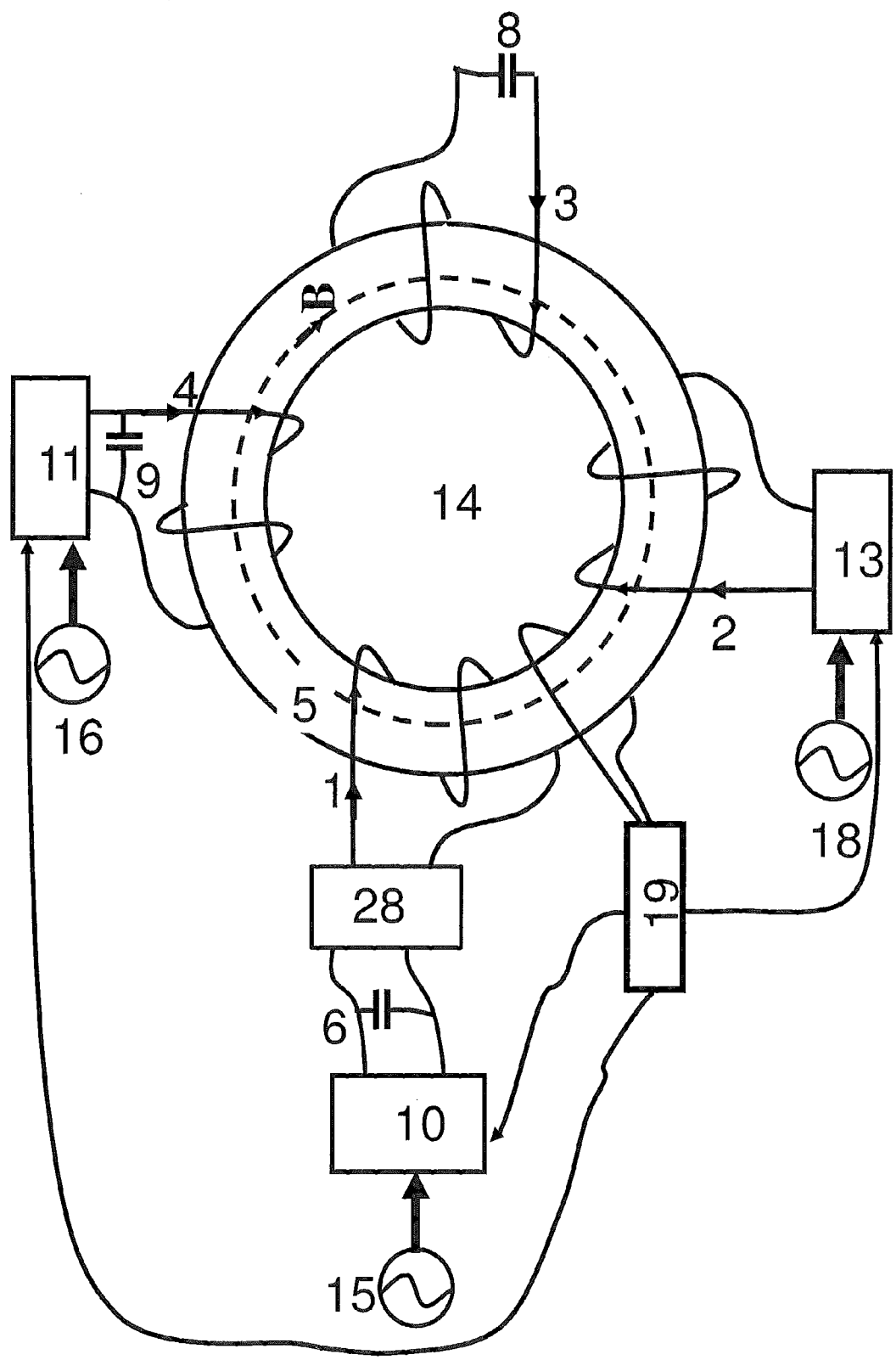
FIG. 3 is a third variation of an excitation device.

It should also be noted that the invented principle can also be used in case that a further reactive transformation network (FIG. 3, 28) is inserted between compensation capacitor (6) and excitation coil (1) to increase the voltage across the coil or to increase the current through the coil to reduce the corresponding values at the power supply's output. Such reactive transformation networks are well known in the art.

The supplies 10-13 for the excitation windings 1-4 must themselves be supplied with energy. Preferably, they (10-13) are fed by the power grid 15-18. Even more preferably, a three-phase 400 V AC power grid is used to supply the excitation modules. Preferably, the power supplies deliver approximately the same currents and thus the same powers to the stator core. In order for all supplies 10-13 to deliver the same excitation currents, at the same frequencies and at the same phases angles, a synchronization unit 19 is provided. The synchronization unit 19 is connected to the excitation modules 1-4. The synchronization unit 19 sends a typically signals to the excitation modules 1-4 which set-the excitation currents, the frequencies and the relative phases between the excitation currents.

Figure 4:
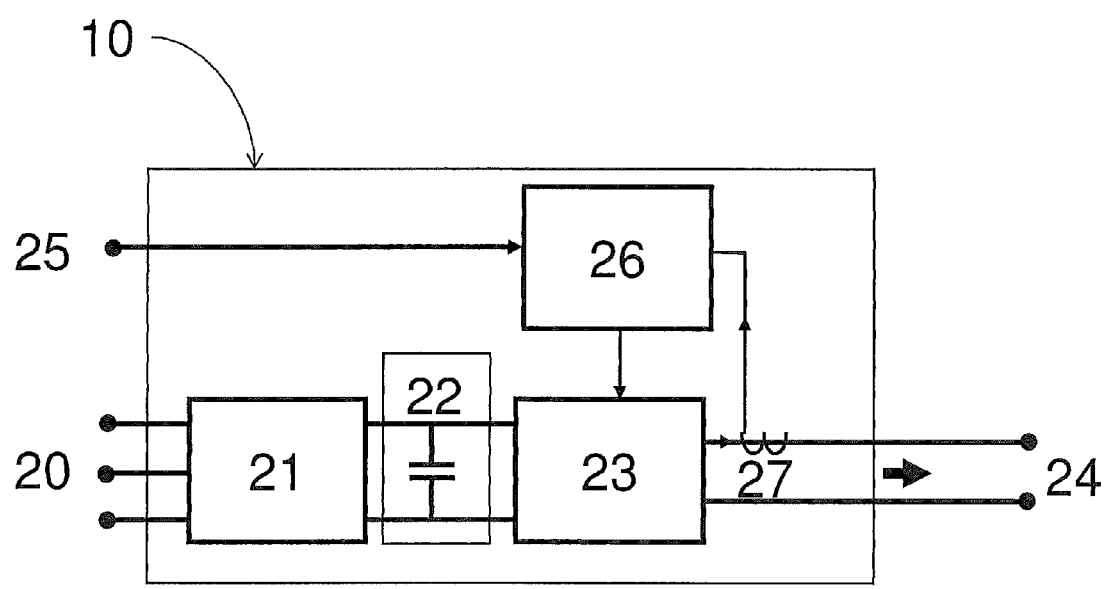
FIG. 4 is a schematic with details of the supply.

FIG. 4 shows an electronic power converter as a typical supply 10. The supply 10 is connected through a three-phase inlet 20 to the power grid 15-18. The inlet 20 feeds an AC/DC converter 21 with preferably, but not necessarily galvanic separation to the grid which charges a capacitor 22 to the required voltage. Afterwards, a controllable DC/AC converter 23 provides the current to the exaction winding 1-4 through an outlet 24. Preferably, the capacitor 22 has a sufficient capacitance, so it can also store energy to provide additional reactive power to an excitation winding 1-4. So in the end the preferable electronic power converter can work in the 4-quadrant mode. Preferably it would also have a power-factor correction circuit (PFC) at its power-input, and be also capable to feed-back power to the grid.

Another input terminal 25 of the supply 10 receives signals from the synchronization unit 19. The signals from the synchronization unit 19 are processed by a control unit 26 together with the readings from a current sensor 27. The control unit 26 communicates with the DC/AC converter 23 to continuously adjust the output current.

To increase the output impedance of the electronic supply 10, a further series inductance may be connected to its 10 outlet 24. Also, a noise-filter may be added at the output to filter out higher-frequency signals generated by the DC/AC converter 23.

Although the present invention has been fully described in connection with preferred embodiments, it is evident that modifications may be introduced within the scope thereof, not considering the application to be limited by these embodiments, but by the contents of the following claims:

The invention claimed is:

1. An excitation device for electro-magnetic excitation of a stator core of an electric generator or motor, excitation device comprising
    one or more excitation modules, each excitation module comprising an excitation winding;
    one or more power supplies configured to contribute to an overall excitation of the stator core by driving an excitation current through the excitation winding which acts as a current source at an output;
    one or more capacitors; and
    a synchronization unit configured to communicate with the one or more power supplies.

2. The excitation device according to claim 1, wherein the one or more capacitors are connected in parallel to the excitation winding.

3. The excitation device according to claim 1, wherein one or more of the one or more capacitors are omitted.

4. The excitation device according to claim 1, wherein one or more of the one or more power supplies are omitted.

5. The excitation device according to claim 1, wherein one or more reactive networks are inserted between the one or more capacitors and the one or more power supplies.

6. The excitation device according to claim 1, wherein an output impedance of the one or more power supplies is at least three times larger than an inductive output impedance of the one or more capacitors.

7. The excitation device according to claim 1, wherein the synchronization unit sets the excitation currents through the excitation windings of each excitation module.

8. The excitation device according to claim 1, wherein the synchronization unit sets same values of the excitation current through the excitation windings of each excitation module.

9. The excitation device according to claim 1, wherein the one or more power supplies generate alternating excitation currents through the excitation windings.

10. The excitation device according to claim 9, wherein a base frequency of the alternating excitation currents is between 45 Hz and 55 Hz.

11. The excitation device according to claim 9, wherein frequencies of the alternating excitation currents are between 55 Hz and 65 Hz.

12. The excitation device according to claim 1, wherein the excitation device is configured to receive electric power from a connection to a 400 V AC source.

13. The excitation device according to claim 12, wherein the 400 V AC source is a three-phase source.

14. The excitation device according to claim 12, wherein the 400 V AC source is a power grid.

15. The excitation device according to claim 1, wherein the one or more power supplies comprise an output filter.

16. The excitation device according to claim 15, wherein the output filter is electrically connected in series with the excitation winding.

17. A method for carrying out an induction test of a stator core of an electric generator or motor, the method comprising:
    arranging the one or more excitation windings around the stator core;
    connecting the one or more excitation windings electrically in parallel to a capacitor;
    connecting the one or more excitation windings to a power supply configured to act as a current source at an output; and
    arranging a synchronization unit to communicate with the power supply.

* * * * *

UNITED STATES PATENT AND TRADEMARK OFFICE
CERTIFICATE OF CORRECTION

| | | |
|---|---|---|
| PATENT NO. | : 9,488,684 B2 | Page 1 of 1 |
| APPLICATION NO. | : 14/279721 | |
| DATED | : November 8, 2016 | |
| INVENTOR(S) | : Hobelsberger et al. | |

It is certified that error appears in the above-identified patent and that said Letters Patent is hereby corrected as shown below:

In the Specification

In Column 1, Line 53, delete "though" and insert -- through --, therefor.

In Column 3, Line 22, delete "sense of" and insert -- sense --, therefor.

In Column 3, Line 25, delete "to fast" and insert -- fast --, therefor.

In Column 4, Line 45, delete "changes" and insert -- change --, therefor.

In Column 5, Line 54, delete "phases" and insert -- phase --, therefor.

In Column 6, Line 23, delete "claims:" and insert -- claims. --, therefor.

In the Claims

In Column 6, Line 27, in Claim 1, delete "excitation" and insert -- the excitation --, therefor.

In Column 6, Line 28, in Claim 1, delete "comprising" and insert -- comprising: --, therefor.

In Column 6, Line 53, in Claim 7, delete "currents" and insert -- current --, therefor.

In Column 7, Line 16, in Claim 17, delete "the one" and insert -- one --, therefor.

Signed and Sealed this
Thirty-first Day of January, 2017

Michelle K. Lee
*Director of the United States Patent and Trademark Office*